(12) United States Patent
Basu et al.

(10) Patent No.: US 10,347,495 B2
(45) Date of Patent: Jul. 9, 2019

(54) SCHEMES FOR SELECTIVE DEPOSITION FOR PATTERNING APPLICATIONS

(71) Applicant: Applied Materials, Inc., Santa Clara, CA (US)

(72) Inventors: Atashi Basu, Menlo Park, CA (US); Abhijit Basu Mallick, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 15/880,671

(22) Filed: Jan. 26, 2018

(65) Prior Publication Data
US 2018/0218914 A1 Aug. 2, 2018

Related U.S. Application Data

(60) Provisional application No. 62/452,609, filed on Jan. 31, 2017.

(51) Int. Cl.
| | | |
|---|---|---|
| *H01L 21/44* | (2006.01) | |
| *H01L 21/285* | (2006.01) | |
| *H01L 21/02* | (2006.01) | |
| *H01L 21/321* | (2006.01) | |
| *H01L 21/32* | (2006.01) | |

(52) U.S. Cl.
CPC .... *H01L 21/28562* (2013.01); *H01L 21/0226* (2013.01); *H01L 21/02205* (2013.01); *H01L 21/02277* (2013.01); *H01L 21/32* (2013.01); *H01L 21/321* (2013.01)

(58) Field of Classification Search
CPC ......... H01L 21/28562; H01L 21/02205; H01L 21/0226; H01L 21/02277; H01L 21/32; H01L 21/321
USPC ....................................................... 438/677
See application file for complete search history.

(56) References Cited

U.S. PATENT DOCUMENTS

| | | | |
|---|---|---|---|
| 6,852,635 B2 | 2/2005 | Satta et al. | |
| 2013/0189837 A1 | 7/2013 | Haukka et al. | |
| 2013/0236657 A1 | 9/2013 | Anthis | |
| 2014/0231744 A1 | 8/2014 | Kumar et al. | |
| 2014/0252620 A1 | 9/2014 | Huang et al. | |
| 2015/0162214 A1 | 6/2015 | Thompson et al. | |
| 2015/0170961 A1 | 6/2015 | Romero et al. | |
| 2016/0064275 A1 | 3/2016 | Liu et al. | |
| 2016/0322213 A1 | 11/2016 | Thompson et al. | |
| 2017/0256402 A1* | 9/2017 | Kaufman-Osborn | H01L 21/32 |
| 2018/0076027 A1* | 3/2018 | Tapily | H01L 21/02172 |

OTHER PUBLICATIONS

PCT International Search Report and Written Opinion in PCT/US2018/015709 dated May 15, 2018, 15 pages.

(Continued)

*Primary Examiner* — David S Blum
(74) *Attorney, Agent, or Firm* — Servilla Whitney LLC

(57) ABSTRACT

Methods of depositing a film selectively onto a first substrate surface relative to a second substrate surface are described. The methods include depositing a second metal on a first metal without protecting the dielectric, protecting the metal with a cross-linked self-assembled monolayer and depositing a second dielectric on the first dielectric while the metal is protected.

20 Claims, 2 Drawing Sheets

(56) References Cited

OTHER PUBLICATIONS

Hashemi, Fatemeh Sadat Minaye, et al., "Self-Correcting Process for High Quality Patterning by Atomic Layer Deposition", ACSNANO (2015), vol. 9, No. 9, pp. 8710-8717.
Hashemi, Fatemeh Sadat Minaye, et al., "Sequential Regeneration of Self-Assembled Monolayers for Highly Selective Atomic Layer Deposition", Adv. Mater. Interfaces 2016, 3, 1600464, 7 pages.
Kalanyan, Berc, et al., "Using Hydrogen to Expand the Inherent Substrate Selectivity Window During Tungsten Atomic Layer Deposition", Chem. Mater. 2016, 28, pp. 117-126.
Selvaraj, Sathees Kannan, et al., "Selective Atomic Layer Deposition of Zirconia on Copper Patterned Silicon Substrates Using Ethanol as Oxygen Source as well as Copper Reductant", J. Vac. Sci. Technol. A 32(1), Jan./Feb. 2014, 5 pages.
Tao, Qian, et al., "On the Initial Growth of Atomic Layer Deposited $TiO_2$ Films on Silicon and Copper Surfaces", Thin Solid Films 520 (2012), pp. 6752-6756.
Tao, Qian, et al., "Selective Atomic Layer Deposition of $HfO_2$ on Copper Patterned Silicon Substrates", Appl. Phys. Lett. 96, 192105 (2010), 4 pages.
Tarre, Aivar, "Atomic layer deposition of $Cr_2O_3$ thin films: Effect of crystallization on growth and properties", Applied Surface Science 254 (2008), pp. 5149-5156.

\* cited by examiner

SCHEMES FOR SELECTIVE DEPOSITION FOR PATTERNING APPLICATIONS

CROSS-REFERENCE TO RELATED APPLICATIONS

This application claims priority to U.S. Provisional Application No. 62/452,609, filed Jan. 31, 2017, the entire disclosure of which is hereby incorporated by reference herein.

FIELD

Embodiments of the disclosure generally relate to methods of selectively depositing a film. More particularly, embodiments of the disclosure are directed to methods of selectively depositing a film using self-assembled monolayers and an optional treatment reactant.

BACKGROUND

Selective deposition processes are gaining a lot of momentum mostly because of the need for patterning applications for semiconductors. Traditionally, patterning in the microelectronics industry has been accomplished using various lithography and etch processes. However, since lithography is becoming exponentially complex and expensive the use of selective deposition to deposit features is becoming much more attractive. Another potential application for selective deposition is gap fill. In gap fill, the fill film is grown selectively from the bottom of a trench towards the top. Selective deposition could be used for other applications such as selective sidewall deposition where films are grown on the side of the fin. This would enable the deposition of a sidewall spacer without the need for complex patterning steps.

Therefore, there is a need in the art for methods of depositing a film onto one surface selectively over a different surface.

SUMMARY

One or more embodiments of the disclosure are directed to selective deposition methods comprising providing a substrate having a first metal surface and a first dielectric surface. A second metal film is selectively deposited on the first metal surface to form a second metal surface. The second metal surface is passivated by forming a cross-linked self-assembled monolayer comprising in the range of about 5 to about 20 carbon atoms to form a passivation layer. A second dielectric film is selectively deposited on the first dielectric surface to form a second dielectric surface. The passivation layer is removed from the second metal surface. The dielectric surface is not passivated during deposition of the second metal film.

Further embodiments of the disclosure are directed to selective deposition methods comprising (a) providing a substrate having a metal surface and a dielectric surface; (b) passivating the metal surface with a cross-linked self-assembled monolayer to form a passivation layer, wherein passivating the metal surface comprises exposing the metal surface to a compound having a head group, carbon chain and tail group that forms a self-assembled monolayer, the carbon chain having in the range of about 5 to about 20 carbon atoms and the tail group including a hydrophobic moiety; (c) depositing a second dielectric film selectively on the first dielectric surface to form a second dielectric surface; (d) removing the passivation layer; (e) depositing a second metal film selectively on the first metal surface to form a second metal surface; and (f) repeating (b) through (e) to grow the second dielectric film and the second metal film to form a second dielectric film of a predetermined thickness and a second metal film of a predetermined thickness. The dielectric surface is not passivated during deposition of the second metal film.

Further embodiments of the disclosure are directed to selective deposition methods comprising providing a substrate having a first metal with a first metal surface and a first dielectric with a first dielectric surface. A film of a second metal is selectively deposited on the first metal surface to form a second metal film with a second metal surface. The second metal is different from the first metal. The second metal surface is passivated by forming a cross-linked self-assembled monolayer comprising a carbon chain having in the range of about 5 to about 20 carbon atoms to form a passivation layer. The cross-linked self-assembled monolayer is formed by exposing the substrate to a SAM precursor and a cross-linking process comprising one or more of a chemical reaction, UV light, electron beam or heat. A film of a second dielectric is selectively deposited on the first dielectric surface to form a second dielectric film with a second dielectric surface. The second dielectric is different from the first dielectric. The passivation layer is removed from the second metal surface. The dielectric surface is not passivated during deposition of the second metal film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
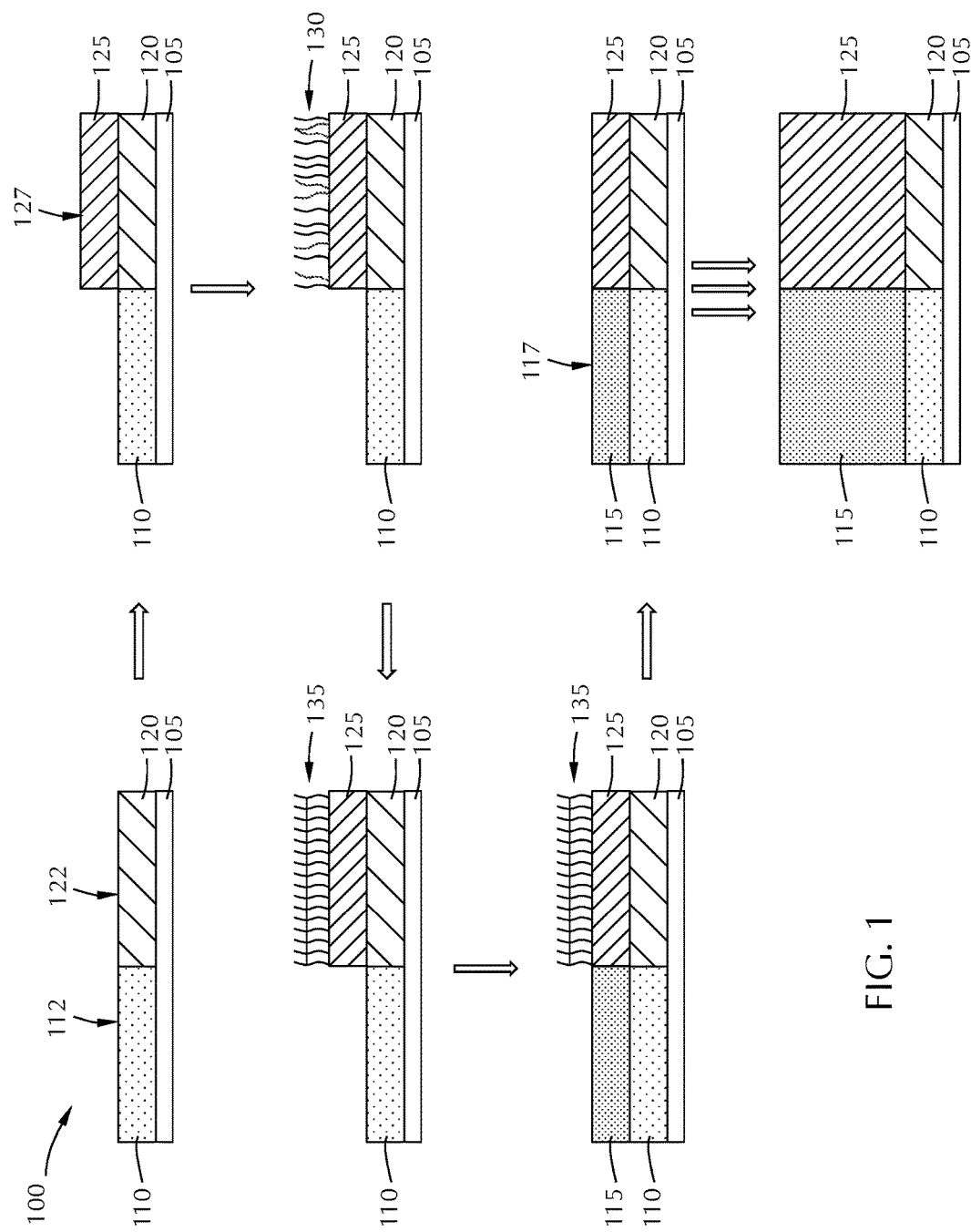
FIG. 1 illustrates a processing method in accordance with one or more embodiment of the disclosure.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface may comprise a metal, metal oxide, or H-terminated $Si_xGe_{1-x}$, and the second substrate surface may comprise a Si-containing dielectric, or vice versa. In some embodiments, a substrate surface may comprise certain functionality (e.g., —OH, —NH, etc.).

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Embodiments of the disclosure provide methods of selectively depositing a film onto one surface over a second surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the desired film thickness is achieved on the target substrate material with negligible deposition on the other substrate materials (where "negligible" is defined by process constraints).

One strategy to achieve selective deposition employs the use of blocking layers. Ideally, this strategy involves (1) formation of a blocking layer on substrate materials on which deposition is to be avoided with negligible impact to the target substrate material, (2) deposition on the target substrate material (where deposition on other substrate materials is "blocked" by the blocking layer), and (3) removal of the blocking layer without net adverse effects to the deposited film.

Embodiments of the disclosure incorporate a blocking layer called a self-assembled monolayer (SAM). A self-assembled monolayer (SAM) consists of an ordered arrangement of spontaneously assembled organic molecules adsorbed on a surface. These molecules are typically comprised of one or more moieties with an affinity for the substrate (head group) and a relatively long, inert, linear hydrocarbon moiety (tail group).

In this case, SAM formation happens through fast adsorption of molecular head groups at the surface and slow association of molecular tail groups with each other through van der Waals interactions. SAM precursors are chosen such that the head group selectively reacts with the substrate materials to be blocked during deposition. Deposition is then performed, and the SAMs are typically removed through thermal decomposition (with desorption of any byproducts) or an integration-compatible ashing process. Successful selective deposition through this idealized formation and use of SAMs has been demonstrated for a number of systems; however, success is essentially limited to a solution-based approach for SAM formation (i.e., wet functionalization). Wet functionalization approaches are not only incompatible with vacuum-based integration schemes but also require sonication post-SAM formation to eliminate physisorbed SAM precursor. This suggests successful selective SAM formation (on one substrate versus another) cannot rely on the functionalization process alone to yield the overall selective chemisorption result with no physisorption.

Referring to FIG. 1, one or more embodiment of the disclosure is directed to a processing method 100 for selective deposition. A substrate 105 is provided with a first dielectric film 110 and a first metal film 120. The first metal film 120 has a first metal surface 122 and the first dielectric film 110 has a first dielectric surface 112.

A second metal film 125 is selectively deposited on the first metal surface 122 of the first metal film 120 to form a second metal surface 127. In some embodiments, the second metal film 125 is a different metal than the first metal film 120. In some embodiments, the second metal film 125 is the same metal as the first metal film 120.

According to some embodiments, the second metal film 125 is selectively deposited on the first metal film 120 without passivation or protection of the first dielectric film 110 or first dielectric surface 112. In some embodiments, the first dielectric film 110 or first dielectric surface 112 is passivated or protected before deposition of the second metal film 125.

After formation of the second metal film 125, the second metal surface 127 is passivated. The passivation layer is a cross-linked self-assembled monolayer (SAM). The cross-linked self-assembled monolayer is formed by exposing the substrate to a SAM precursor to form a self-assembled monolayer 130 and a cross-linking process to form cross-linked self-assembled monolayer 135, as shown in FIG. 1. The SAM precursor can be a single compound or sequential exposures to form the self-assembled monolayer 130. For example, the second metal surface 127 may be exposed to a single compound that assembles on the surface in an ordered or semi-ordered manner. In some embodiments, the self-assembled monolayer 130 is formed by exposing the surface to a first SAM precursor and a reactant that creates the self-assembled monolayer 130.

The SAM precursor of some embodiments comprises a composition with a head group and a tail group. As used in this manner, the "head group" is a chemical moiety that associates with the second metal surface 127 and the "tail group" is a chemical moiety that extends away from the second metal surface 127. In some embodiments, the head group comprises one or more of a silyl group (SiR$_3$), a phosphate group (—PO$_3$H) or a thiol group (—SH). The silyl group can be a halogenated silyl, for example, trimethylsilyl. The head group of some embodiments adsorbs to the second metal surface 127 relatively quickly.

The self-assembled monolayer 130 and/or cross-linked self-assembled monolayer 135 of some embodiments have in the range of about 5 to about 20 carbon atoms. The carbon chain can be branched or unbranched, or substituted or unsubstituted. In some embodiments, there are greater than about 5, 6, 7, 8, 9, 10, 11, 12, 13, 14, 15, 16, 17 or 18 carbon atoms. In some embodiments, there are in the range of about 6 to about 18 carbon atoms, or in the range of about 7 to about 17 carbon atoms, or in the range of about 8 to about 16 carbon atoms, or in the range of about 9 to about 15 carbon atoms or in the range of about 10 to about 14 carbon atoms. In some embodiments, the tail groups associate with each other through relatively slow van der Waals interaction. The tail groups can be the same or different so that a homogeneous or heterogeneous SAM can be formed.

In some embodiments, the SAM precursor comprises more than one head group that can chemisorb onto the substrate surface. In some embodiments, at least one head group does not chemisorb onto the substrate surface and is available to react with a co-reactant. In one or more embodiments, exposing the substrate to the SAM precursor further comprises exposing the substrate to a co-reactant to form the self-assembled monolayer. The co-reactant can be co-flowed into the process chamber with the SAM precursor; either mixing prior to the process chamber or within the process chamber. In some embodiments, the co-reactant and the SAM precursor are exposed to the substrate surface sequentially so that there is no, or little, gas phase mixing of the SAM precursor and the co-reactant.

In some embodiments, the SAM precursor comprises one or more of

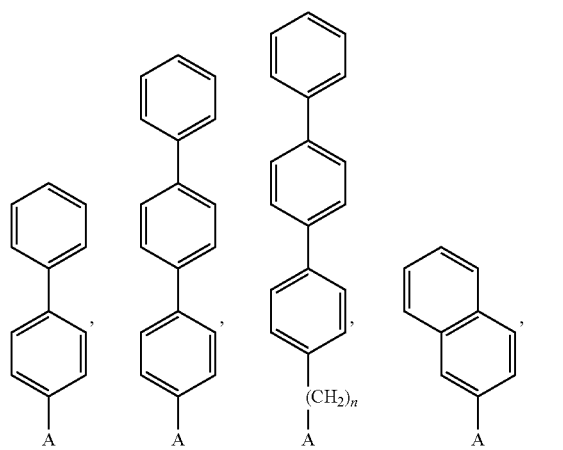

where A is the head group and n is in the range of about 1 to about 20, or in the range of about 2 to about 15.

In some embodiments, the SAM precursor comprises one or more of where n is in the range of about 4 to about 20, or in the range of about 5 to about 15.

Once formed, the self-assembled monolayer 130 can be exposed to a cross-linking process to form the cross-linked self-assembled monolayer 135. The cross-linking process can be any suitable process including, but not limited to, a chemical reaction, UV light exposure, electron beam exposure and/or heat. Examples of cross-linking reactions are illustrated in Schemes I and II.

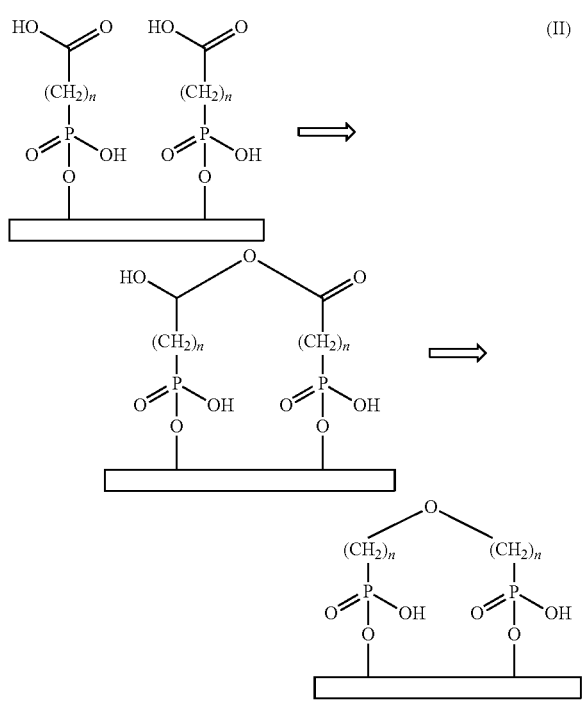

(II)

After formation of the cross-linked self-assembled monolayer 135, a second dielectric film 115 is deposited on the first dielectric surface 112 of the first dielectric film 110 selectively over the second metal film 125. The cross-linked self-assembled monolayer 135 provides a protecting group to prevent or minimize deposition of the second dielectric film 115 on the first metal film or second metal film or surfaces. In some embodiments, the second dielectric film 115 is a different metal than the first dielectric film 110. In some embodiments, the second dielectric film 115 is the same dielectric as the first dielectric film 110.

After selective deposition of the second dielectric film 115 on the first dielectric film 110, the cross-linked self-assembled monolayer 135 passivation layer is removed from the second metal surface. In some embodiments, the cross-linked self-assembled monolayer 135 is removed from the surface by oxidation. In some embodiments, the cross-linked self-assembled monolayer 135 is etched from the surface. In some embodiments, the cross-linked self-assembled monolayer 135 is dissolved in a suitable solvent (e.g., ethanol).

In some embodiments, the process is repeated to deposit additional second metal film 125 on the second metal surface 127 to grow a thickness of the second metal film to a predetermined amount. Stated differently, some embodiments further comprise repeating deposition of additional second metal film, passivating the second metal surface, depositing additional second dielectric film and removing the passivation layer to grow a second metal film of a predetermined thickness and a second dielectric film of a predetermined thickness.

In some embodiments, the final thickness of the second metal film is in the range of about 1 nm to about 1000 nm, or in the range of about 10 nm to about 500 nm, or in the range of about 50 nm to about 250 nm. In some embodiments, the process is repeated to deposit additional second dielectric film 115 on the second dielectric surface 117 to form a second dielectric film 115 of a predetermined thickness. In some embodiments, the final thickness of the second dielectric film 115 is in the range of about 1 nm to about 1000 nm, or in the range of about 10 nm to about 500 nm, or in the range of about 50 nm to about 250 nm.

Each cycle of deposition of the second metal film 125 and the second dielectric film 115 can form a layer of any suitable thickness. In some embodiments, each cycle of the second metal film 125 and/or second dielectric film 115 results in deposition of a film with a thickness in the range of about 1 nm to about 100 nm, or in the range of about 5 nm to about 50 nm, or in the range of about 10 nm to about 50 nm.

Figure 2:
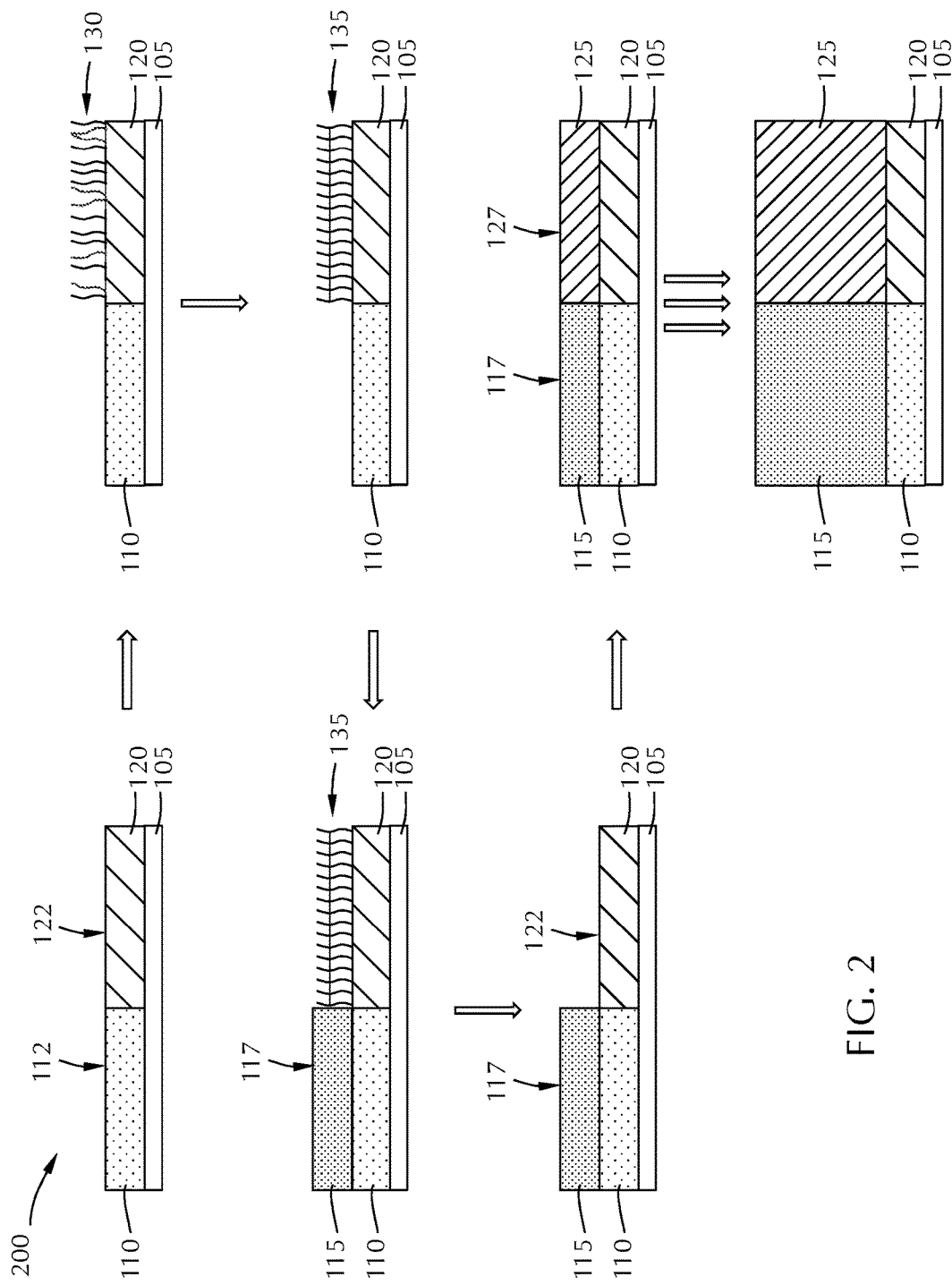
FIG. 2 illustrates a processing method in accordance with one or more embodiment of the disclosure.

FIG. 2 shows another embodiment of a selective deposition method 200. A substrate 105 having a metal surface 122 and a dielectric surface 112 is provided. The metal surface 122 is passivated with a self-assembled monolayer 130 which is cross-linked to form a cross-linked self-assembled monolayer 135 to form a passivation layer. Passivating the metal surface comprises exposing the metal surface to a compound having a head group, carbon chain and tail group that forms a self-assembled monolayer 130. The carbon chain of some embodiments has in the range of about 5 to about 20 carbon atoms and the tail group includes a hydrophobic moiety. The carbon chain can be linear, branched, substituted or unsubstituted.

A second dielectric film 115 is deposited selectively on the first dielectric surface 112 of the first dielectric film 110 to form a second dielectric surface 117. The passivation layer is then removed from the first metal surface 122 and a second metal film 125 is deposited on the first metal surface 122 selectively over the second dielectric surface 117 or second dielectric film 115. The second metal film 125 has a second metal surface 127. The formation of the passivation layer, deposition of the second dielectric film, removal of the passivation layer and deposition of the second metal film can be repeated to continue to grow the thicknesses of the second dielectric film and the second metal film.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A selective deposition method comprising:
   providing a substrate having a first metal surface and a first dielectric surface;
   depositing a second metal film selectively on the first metal surface to form a second metal surface;
   passivating the second metal surface by forming a cross-linked self-assembled monolayer comprising in the range of about 5 to about 20 carbon atoms to form a passivation layer;
   depositing a second dielectric film selectively on the first dielectric surface to form a second dielectric surface; and
   removing the passivation layer from the second metal surface,
   wherein the first dielectric surface is not passivated during deposition of the second metal film.

2. The method of claim 1, wherein forming the cross-linked self-assembled monolayer comprises exposing the substrate to a SAM precursor and a cross-linking process.

3. The method of claim 2, wherein the SAM precursor comprises a composition with a head group and a tail group.

4. The method of claim 3, wherein the head group comprises one or more of a silyl, phosphate or thiol group.

5. The method of claim 4, wherein the SAM precursor comprises one or more of

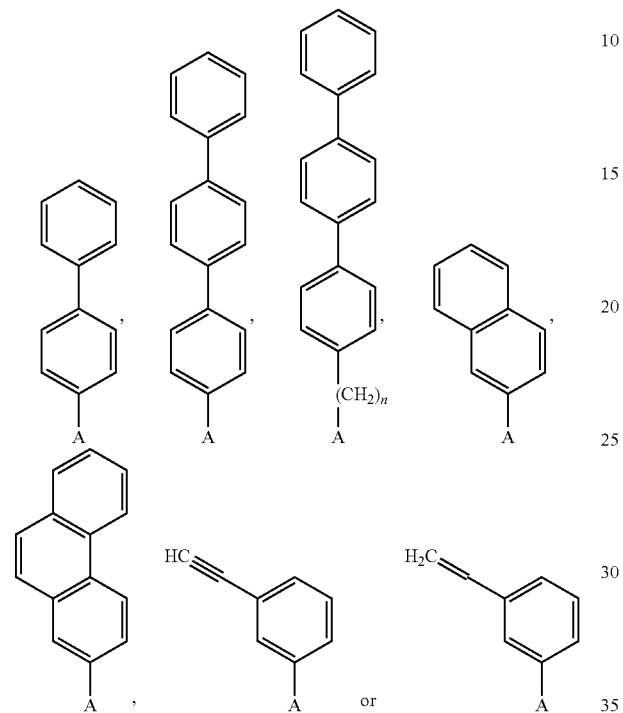

where A is the head group.

6. The method of claim 3, wherein the head group adsorbs to the second metal surface relatively quickly.

7. The method of claim 6, wherein the tail groups associate through relatively slow van der Waals interaction.

8. The method of claim 2, wherein the cross-linking process comprises one or more of a chemical reaction, UV light, electron beam or heat.

9. The method of claim 1, further comprising:
depositing additional second metal film selectively on the second metal surface to grow a thickness of the second metal film;
passivating the second metal surface to form a passivation layer;
depositing additional second dielectric film selectively on the second dielectric surface to grow a thickness of the second dielectric film; and
removing the passivation layer.

10. The method of claim 9, further comprising repeating depositing additional second metal film, passivating the second metal surface, depositing additional second dielectric film and removing the passivation layer to grow a second metal film of a predetermined thickness and a second dielectric film of a predetermined thickness.

11. The method of claim 10, wherein the second metal film is different from the first metal surface and the second dielectric film is different from the first dielectric surface.

12. A selective deposition method comprising:
(a) providing a substrate having a first metal surface and a first dielectric surface;
(b) passivating the metal surface with a cross-linked self-assembled monolayer to form a passivation layer, wherein passivating the metal surface comprises exposing the metal surface to a compound having a head group, carbon chain and tail group that forms a self-assembled monolayer, the carbon chain having in the range of about 5 to about 20 carbon atoms and the tail group including a hydrophobic moiety;
(c) depositing a second dielectric film selectively on the first dielectric surface to form a second dielectric surface;
(d) removing the passivation layer;
(e) depositing a second metal film selectively on the first metal surface to form a second metal surface; and
(f) repeating (b) through (e) to grow the second dielectric film and the second metal film to form a second dielectric film of a predetermined thickness and a second metal film of a predetermined thickness,
wherein the dielectric surface is not passivated during deposition of the second metal film.

13. The method of claim 12, wherein forming the cross-linked self-assembled monolayer comprises exposing the substrate to a SAM precursor and a cross-linking process.

14. The method of claim 13, wherein the SAM precursor comprises a composition with a head group and a tail group.

15. The method of claim 14, wherein the head group comprises one or more of a silyl, phosphate or thiol group.

16. The method of claim 15, wherein the SAM precursor comprises one or more of

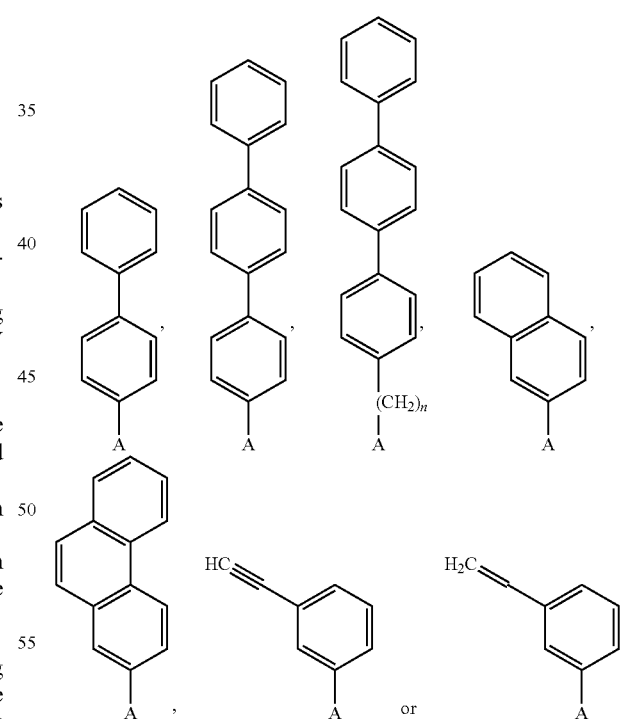

where A is the head group.

17. The method of claim 14, wherein the head group adsorbs to the second metal surface relatively quickly.

18. The method of claim 14, wherein the tail groups associate through relatively slow van der Waals interaction.

19. The method of claim 13, wherein the cross-linking process comprises one or more of a chemical reaction, UV light, electron beam or heat.

20. A selective deposition method comprising:
providing a substrate having a first metal with a first metal surface and a first dielectric with a first dielectric surface;
depositing a film of a second metal selectively on the first metal surface to form a second metal film with a second metal surface, the second metal different from the first metal;
passivating the second metal surface by forming a cross-linked self-assembled monolayer comprising a carbon chain having in the range of about 5 to about 20 carbon atoms to form a passivation layer, the cross-linked self-assembled monolayer formed by exposing the substrate to a SAM precursor and a cross-linking process comprising one or more of a chemical reaction, UV light, electron beam or heat;
depositing a film of a second dielectric selectively on the first dielectric surface to form a second dielectric film with a second dielectric surface, the second dielectric different from the first dielectric; and
removing the passivation layer from the second metal surface,
wherein the first dielectric surface is not passivated during deposition of the second metal film.

* * * * *